United States Patent [19]

Sarkissian et al.

[11] 4,110,842
[45] Aug. 29, 1978

[54] RANDOM ACCESS MEMORY WITH MEMORY STATUS FOR IMPROVED ACCESS AND CYCLE TIMES

[75] Inventors: Vahe A. Sarkissian, Saratoga; Nagab Jayakumar; Joseph H. Kroeger, both of Sunnyvale; Jeffrey M. Schlageter, Saratoga, all of Calif.

[73] Assignee: Advanced Micro Devices, Inc., Sunnyvale, Calif.

[21] Appl. No.: 741,971

[22] Filed: Nov. 15, 1976

[51] Int. Cl.$^2$ .............................................. G11C 7/04
[52] U.S. Cl. ..................................... 365/233; 365/211
[58] Field of Search ... 364/200 MS File, 900 MS File; 340/173 R, 173 DR; 235/302.3; 365/233, 210, 212, 201, 194

[56] References Cited

U.S. PATENT DOCUMENTS

| | | | |
|---|---|---|---|
| 3,510,680 | 5/1970 | Cogar | 307/221 |
| 3,736,575 | 5/1973 | Mallerich, Jr. | 340/173 R |
| 3,778,784 | 12/1973 | Karp et al. | 340/173 R |
| 3,796,998 | 3/1974 | Appelt | 340/173 DR |
| 3,800,295 | 3/1974 | Anderson, Jr. et al. | 340/173 R |
| 3,809,884 | 5/1974 | Nibby et al. | 340/173 DR |
| 3,855,483 | 12/1974 | Karp et al. | 340/173 BB |
| 3,940,747 | 2/1976 | Kuo et al. | 340/173 DR |
| 3,946,368 | 3/1976 | Chou | 340/173 R |

OTHER PUBLICATIONS

Schlageter et al., "Two 4K Static 5-V Ram's", IEEE Journal of Solid-State Circuits, vol. sc-11, No. 5, Oct. 1976, pp. 602-609.

Primary Examiner—Bernard Konick
Assistant Examiner—Donald McElheny

[57] ABSTRACT

A static random access memory which generates a memory status signal for improved performance. The same signal in a random access memory which enables data to go to the output is taken to form the leading edge of a memory status signal, indicating that output data is available. The trailing edge of the pulse, indicating a memory readiness condition, is formed upon completion of memory preset. The memory status signal tracks variations in performance of the data storage cells due to voltage, temperature and other processing variables, thus permitting access of data when data is actually available for reading, rather than on worst case considerations.

11 Claims, 20 Drawing Figures

RANDOM ACCESS MEMORY WITH MEMORY STATUS FOR IMPROVED ACCESS AND CYCLE TIMES

BACKGROUND OF THE INVENTION a. Field of the Invention

The invention relates to an organization for improving the efficiency of semiconductor random access memories and more particularly, to a semiconductor random access memory having a memory status indicator for indicating the availability of data.

b. Prior Art

Semiconductor integrated circuit random access memories (RAMs) have been known for several years. For example, an article entitled, "Integrated MOS Transistor Random Access Memory" by John D. Schmidt, in Solid State Design, January, 1965, pp. 21-25, describes a static RAM which may use a six transistor storage cell. See also U.S. Pat. No. 3,447,137.

It has been recognized in first in - first out shift registers (FIFO), that a "data shift flag" is advantageous for indicating the position of a data bit as it ripples through the register. For example, see U.S. Pat. No. 3,736,575. Although the "data shift flag" is not applicable to random access memories, it is a timing signal which is useful.

In the prior art, semiconductor memories were operated with times which were specified to be dependent on expected worst case conditions of semiconductor processing, temperature and voltage fluctuations. To meet acceptable specified performance levels, it was necessary to allow for the occasional occurrence of worst case conditions. Some very large systems control memory operation with signals which indicate memory status, but this is unknown in semiconductor memory.

It was our object to device a random access memory which operates at its fastest possible rate and not limited to worst case specifications.

SUMMARY OF THE INVENTION

The above-mentioned object is achieved in an integrated circuit random access memory which indicates the availability of valid data and the completion of memory cycle. This is important, because both memory access and cycle time change with voltage, temperature and other processing variables. Thus, as these changes occur, the memory status signal indicates a longer or shorter time for memory access and cycle times. By combining two or more integrated circuit chips with memory status signals, an adjustment can be made for different chips which are used. When used in systems, memory status presents an asynchronous signal for interfacing memory with the remainder of the system.

The novel memory status signal is generated by a reference row of cells in the memory array. The reference row is designed to track the variations in performance of the data storage cells.

DESCRIPTION OF THE DRAWINGS

FIG. 12b is a timing diagram for the apparatus of FIG. 12a.

DESCRIPTION OF THE PREFERRED EMBODIMENT

Figure 1:
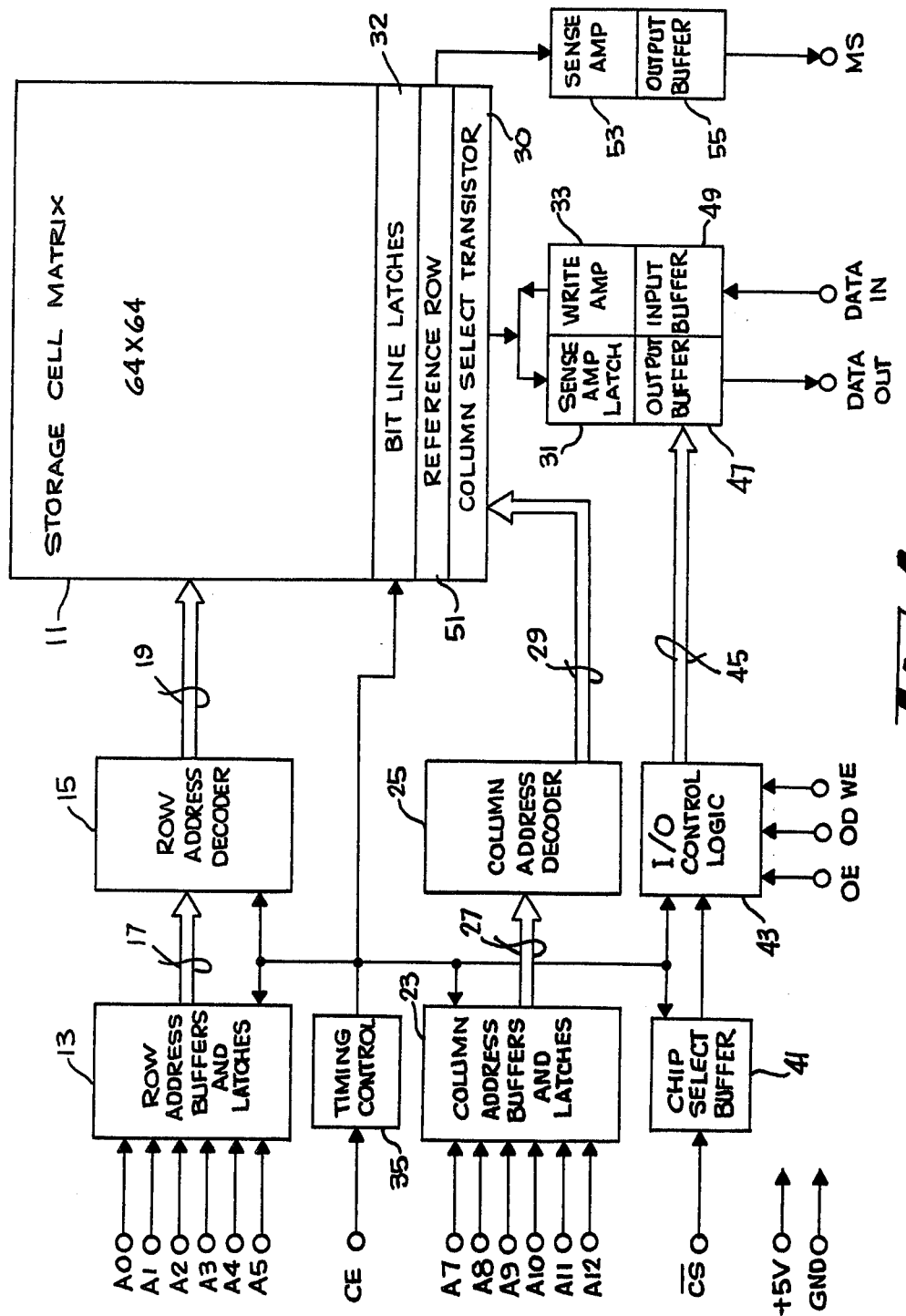
FIG. 1 is a block diagram of a random access memory incorporating the improvement of the present invention.

FIG. 1 is a block diagram of circuits on an integrated circuit chip forming a 4K bit, static, random access memory (RAM) which uses a single 5 volt power supply and which is compatible with TTL logic levels, although the chip itself is entirely MOS construction.

The chip shown in the block diagram of FIG. 1 has 22 pins or terminals, which are external connections to other circuits. There are six row address input terminals, A0-A5, and six column address input terminals, A6-A11. Thre is a single power supply terminal, plus 5 volts, +5V, and a ground terminal, GND. There is a terminal for a timing signal, CE, and a terminal for a chip select signal, CS. There are terminals for output enable, OE, output disable, OD, and write enable, WE. There is a data output terminal, DATA OUT; a data input terminal, DATA IN; and a memory status terminal, MS.

The heart of the chip is the storage cell matrix 11, which is shown to be a 64 by 64 cell array. Other organizations are possible, and are known to those skilled in the art. It is this 64 by 64 array which yields a 4K bit memory, actually 4,096 cells. The present invention is not limited to this number of cells or the organizations specified herein. These are merely exemplary.

Any one of the cells in the storage matrix 11 may be specified by a row address, with signals into terminals A0-A5, and a column address with signals on the input terminals A6-A11. An input row address is transmitted to the row address buffers and latches 13. The row address buffers convert the input row address signal, which may arrive in TTL logic, to MOS level logic and generate address complement signals. The row address information is latched by conventional flip flop latches for transmission to the row address decoders 15. Twelve data lines 17 connect the latches 13 to the decoders 15, two lines for each latch, one for the address, and one for its inversion. The row address decoder 15 determines which of the 64 rows have been specified by the row address input signals in the terminals A0–A5. Sixty-four lines 19 connect the row address decoders 15 with the storage cell matrix 11. Upon decoding a row address one of the 64 lines, 19, identifies one of 64 rows in the storage cell matrix 11.

Column address information, fed into terminals A6–A11, is indirectly transmitted to the storage cell matrix 11 as follows. Column identification is transmitted into the six input terminals A6–A11 and from there to the column address buffers and latches 23 which level shifts from TTL logic to MOS logic and latch the input signals in flip flop type latches, known as address latches explained below. The latched information is transmitted by means of the 12 lines, 27, to the column address decoder 25 which selects one of 64 columns specified by the address input signals. Sixty-four lines, 29, connect the column address decoder 25 with the column select transistors 30. One transistor pair is provided for each column. A sense amplifier and latch 31 is associated with reading information in the storage cell matrix 11, while the write amplifier 33 is associated with writing information in the matrix.

A timing control 35 receives an external timing signal, CE, for clocking the bit line latches 32, the decoders 15 and 25, and the buffers and latches, 13, 23, as well as the chip select buffer 41 and control logic 43. A chip select signal is transmitted to the chip select buffer which level shifts and latches the input signal for transmission to the input/output control logic 43. Control logic 43 receives output enable, OE, output disable, OD, and write enable, WE, signals for transmission through the signal lines 45 to the output buffer 47 and the input buffer 49. These buffers adjust output and input signal levels to the appropriate level for use with the proper timing relationships.

Figure 2:
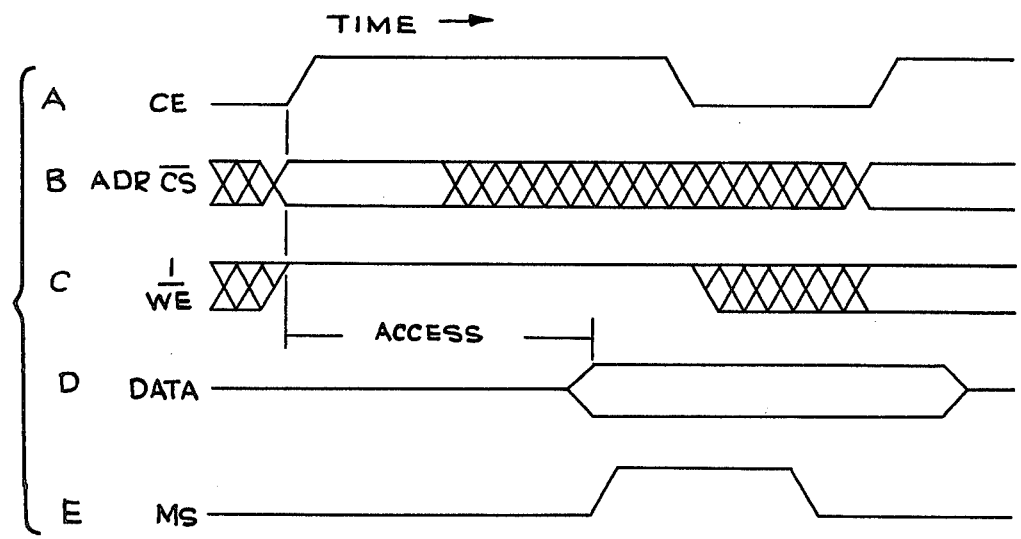
FIG. 2, including A through E, is a timing diagram for the apparatus of FIG. 1.

With reference to FIGS. 1 and 2, the address input signals are latched into on-chip address registers 13 and 23 by the rising edge of CE, see graphs A and B in FIG. 2. They are allowed to become stable at the same time that the clock goes high. They must be held stable for the specified minimum time following the CE rising edge in order to be properly loaded into the register. Once the address hold time has been observed, the address inputs are ignored by the memory until the next cycle is initiated.

The chip select input, CS, fed to chip select buffer 41, acts as a high order address for use when the memory system word capacity is larger than the word capacity of an individual chip. When they are stacked up, the address lines may be wired in parallel to all chips and the CS lines used to individually select one active chip, or row of chips, at a time. Chip select controls the operation of both the output buffers and the write amplifiers. Unselected chips have their output buffers off so that selected chips wired to the same data lines can dominate the output bus. Only selected chips can perform write operations so the write enable control signal WE, and the input data lines to input buffer 49 may be wired in parallel to several chips.

CS is latched into the on-chip register in the same way that addresses are. This means that once a memory is selected or deselected, it will remain that way until a new cycle with new select information begins. The OE and OD lines connected to control logic 43 provide asynchronous control over the output buffer when that function is necessary on a selected chip.

Chip select is an active low function — that is, the input signal must be low at the rising edge of CE in order to select the chip. Most CS signals are derived from high order addresses.

The write enable line, WE, connected to control logic 43, controls the read or write status of the devices. When the CE clock is low, the WE signal may be any value without affecting the memory. This allows the line to be indeterminant while the using system is deciding what the next cycle will be. WE does not affect the status of the output buffer.

To execute a read cycle, WE is held high while CE is high as shown in graphs A and C of FIG. 2. To perform a write operation, the WE line is switched low during the cycle. In many cases, it will be convenient to leave the WE line low during the whole write cycle so that no intra-cycle timing is necessary for a write operation. WE may remain low continuously as long as successive write cycles are being executed.

A write cycle can take place only when three conditions are met: the chip is selected, CE is high, and WE is low. This means that if either CE goes low or WE goes high, the writing is terminated. Thus, the full minimum write pulse width must appear within the CE high time to perform a successful write.

If WE is low when CE goes high to initiate a new cycle, the write amplifier is enabled and the write data propagates onto the data lines internally. However, no columns or rows are selected until after the address for the new cycle is decoded, so actual writing into the cell is delayed by the decoding time following CE.

Termination of a write operation occurs when either WE goes high or CE goes low. Input data may arrive earlier than the set-up time, where convenient. If incoming data changes during a write operation, the information finally written in the cell will be that stable data preceeding the termination by the set-up time. The data input hold time with respect to the termination of write is zero. If the Data In and Data Out lines remain separate, the input data may occupy the bus at all times, if desired. The valid written data is then determined by the timing of WE.

Since the data being written during a write cycle is impressed on the sense amplifier, 31, inputs, the output data will be the same as the input once the write is established. The conflicts occur with old output data that remains from a previous cycle or with new data that may be accessed before the write is established. If the write (and the associated input data) can be initiated while the output buffers are turned off, the conflict is eliminated; even if the outputs turn on, the output data will match the input data.

During a read cycle, once all of the addressing is complete and the cell information has propagated through the sense amplifier 31, it enters an output data register 47. The read information can also flow through to the output if the buffer is enabled. As long as CE is high, the addressing remains valid and the output data will be stable. When CE goes low to begin the internal preset operation, the output information is latched into the data register. It will remain latched and stable as long as CE is low.

At the start of every cycle when CE goes high, the output data latch is cleared in preparation for new information to come from the sense amplifier, 31 and the output buffer is turned off. This is done so that in multiple chip systems with the outputs bussed together, old data from one chip will not interfere with new data being accessed on another.

The OE and OD control lines connected to control logic 43 perform the same internal function except that one is inverted from the other. If either OE is low or OD is high, the output buffer will turn off. If the CS input is latched low and OE is high and OD is low, then the output buffer can turn on when data is available.

OE and OD are designed to provide asynchronous control of the output buffer independent of the chip select control. This capability makes it easy to tie together the Data In and Data Out lines.

Memory Status

Memory status, MS, is a novel, unique output signal, taken from output buffer 55, that offers several important features for the memory system designer. It indicates when data is valid at the outputs, when CE may be brought low, and when preset is complete so that a new cycle may begin. The memory status signal may be completely ignored without affecting the operation of the memory. On the other hand, it has several implications that make it a potentially interesting and useful signal.

A major function of the MS signal is to indicate actual performance of the memory rather than the worst-case specified performance. Thus, the access time indicated by memory status will always be better than the worst-case specification as long as the conditions and assumptions on which the worst-case numbers are predicated are better. Further, real operating results change with changing conditions and memory status follows these changes. Thus, for example, as temperature decreases, access time also decreases and MS tracks the change in access. Generation of the MS pulse is explained below.

Figure 3:
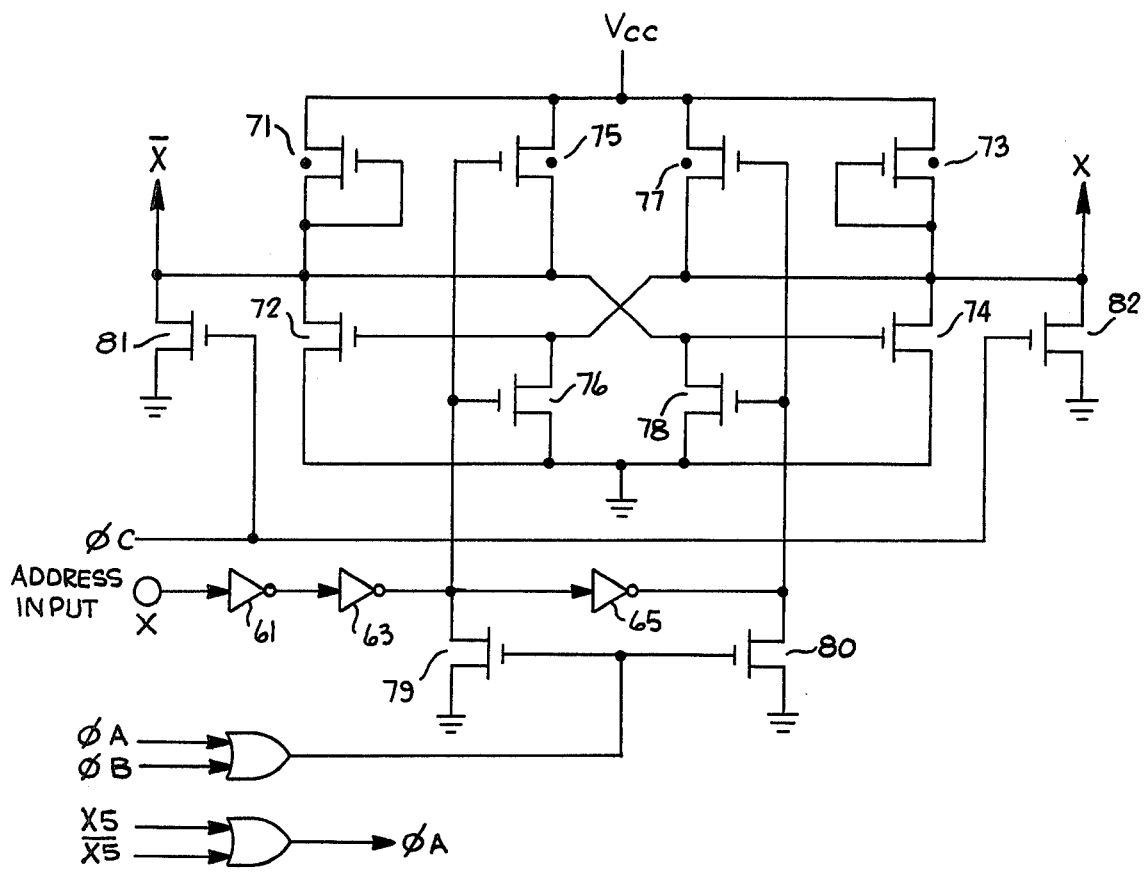
FIG. 3 is a schematic diagram of a row and column input latch circuit for a single address bit.

The detailed circuitry for the address registers 13 and 23 of FIG. 1 is shown in detail in FIG. 3. In FIG. 3, an input latch for a single data bit, A5, is shown. Inverters 61 and 63 isolate the register from the input pin and convert the TTL input levels to the wider logic swings used internally. Inverter 65 inverts the address so that both the addresses A5 and $\overline{A5}$ propagate to the inputs of the register.

Transistors 71, 73, 75, and 77 are depletion devices. Transistor pairs 71, 72 and 73, 74 form two inverters that are cross-coupled to provide the basic latch. Transistor pairs 75, 76 and 77, 78 are used to enter information into the latch. If node A goes high, the 75 and 76 turn on and 77 and 78 turn off, forcing the latch to one polarity. Notice that the circuit would work without transistors 75 or 77. They are added to minimize the propagation delay through the register.

When transistors 79 and 80 are turned on, 75, 76, 77 and 78 are turned off and the latch is isolated from the input signal. When transistors 71 and 72 are turned on, the outputs from the register are held low and the following address decoders are in their preset state.

Figure 4:
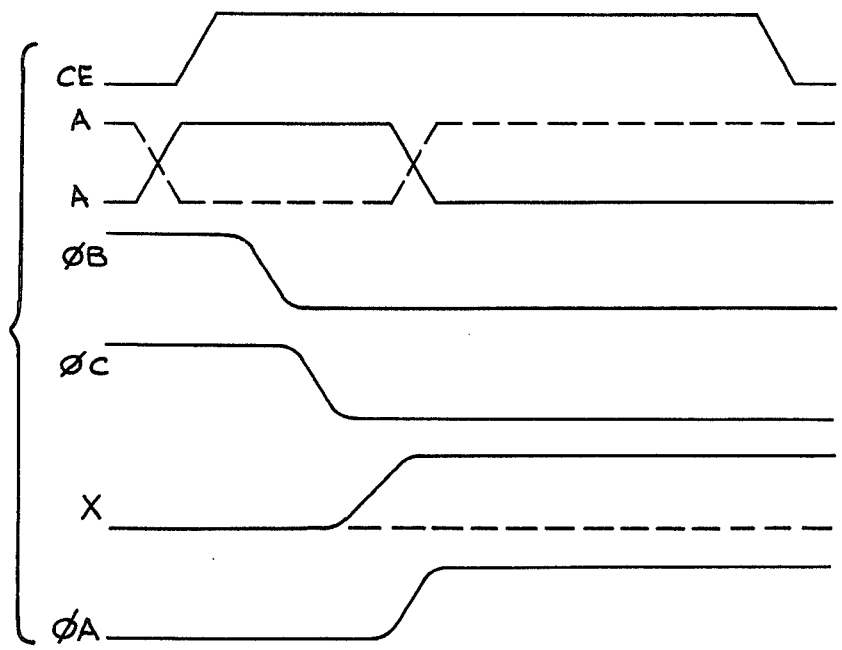
FIG. 4 is a timing diagram for the latch circuit of FIG. 3.

The timing for the address register operation is shown in FIG. 4. The graphs showing $\phi B$ and $\phi C$ are simply delayed inversions of CE. $\phi A$ is derived from the outputs of the slowest bit position in the address register. During the preset state of the memory when the CE clock is low, both $\phi B$ and $\phi C$ are high and $\phi A$ is low. In that condition, transistors 79, 80, 81 and 82 are all turned on and no signals can travel into or out of the register.

When CE goes high to start a cycle, $\phi B$ goes low after a brief delay. This turns off transistors 79 and 80 and opens a window that allows the address information at the input to proceed into the latch. The path that generates $\phi B$ is slightly longer than the path that the address follows to the register. This is done so that the address setup time relative to CE can be specified as zero.

Next, $\phi C$ also goes low, permitting the latch to set and the register outputs to travel on to the decoders. The delay from $\phi B$ to $\phi C$ prevents any address spiking from disturbing the decoding circuits.

During the preset time, address signals X5 and $\overline{X5}$ are held low, keeping $\phi A$ low. After the active cycle starts, either X5 or $\overline{X5}$ will make a transition high, depending on the state of the address input, A5. Thus, $\phi A$ will go high in every memory cycle. When it does, transistors 79 and 80 will turn on again, closing the window into the latch. This prevents any changes in external address information from affecting the stored address. Notice that $\phi A$ is dependent on the presence of address information and only occurs after the address has reached the register outputs.

There are 64 of the row decoder circuits in row address decoder 15 of FIG. 1. One of these decoder circuits is shown in more detail in FIG. 6. The decoding is done by a six-input nor gate having input transistors 91, 92, 93, 94, 95, 96 that are selectively wired to the outputs from the six low order bits of the address register. Each gate of the 64 gates has a unique combination of X and $\overline{X}$ signals on its inputs, $2^6 = 64$. Only one decoder will have all of its inputs low during the decoding. The other 63 gates have at least one input high, thus keeping the decoder output low and the row driver, 98, off. The single selected gate allows its row driver to turn on.

$\phi A$, which is derived from the transitions of the A$\phi$-A5 address input data bit signals, is buffered by inverters 97, 99 and used as $\phi DEC$, the decoder clock. When $\phi DEC$ goes high, it passes through the selected row driver and brings the associated row select line high. All the other row select lines remain low. During the preset time when CE is low, all of the decoders have all of their inputs held low by $\phi C$, in FIG. 4, thus enabling all of the row drivers. To keep all the rows unselected, $\phi DEC$ is low during the preset time and keeps all the select lines low.

There is a latch connected to each of the 64 select lines. It holds its select line low and prevents it from floating when the row driver is turned off. An active, high, row select line flips and holds the latch in addition to driving the 64 cells in the row.

Figure 5:
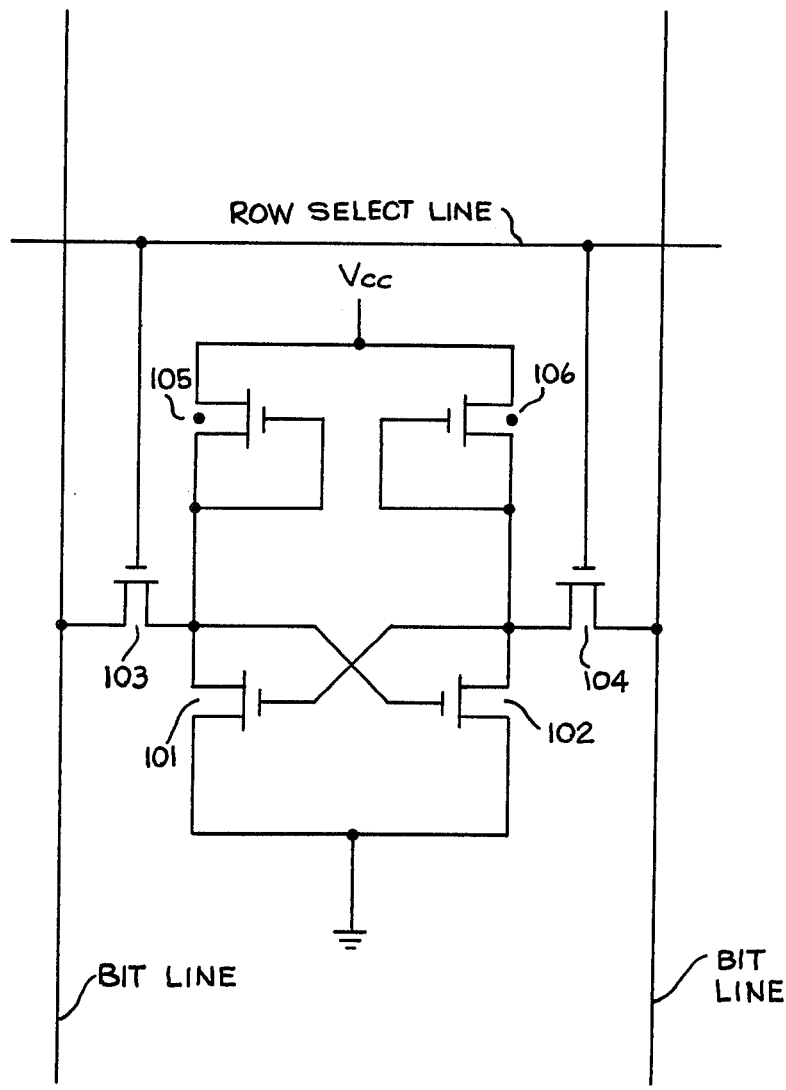
FIG. 5 is a schematic diagram of a six transistor storage cell used in the storage cell matrix of FIG. 1.

The storage cells that are the heart of the storage cell matrix 11 of FIG. 1, use a conventional static design with six transistors. This is shown in detail in FIG. 5. Transistor pairs 101, 105 and 102, 106 are connected as simple inverters that are cross-coupled to form a bistable latch. Either transistor 101 or 102 is turned on and defines the data state of the cell. Transistors 105 and 106 are depletion-mode devices that act as pullups and maintain the state of the latch as long as power is applied.

The access devices permit the cell to be attached to its respective bit lines. When the cell's row select line is low, transistors 103 and 104 are off and the cell is isolated from all other circuitry. When the select line is high, 103 and 104 are on and the cell is connected to the bit lines. If a read operation is in progress, the cell then pulls one of the bit lines low. If a write operation is being performed, the bit lines are driven by the data to be written and the cell is forced into the desired state.

Figure 7:
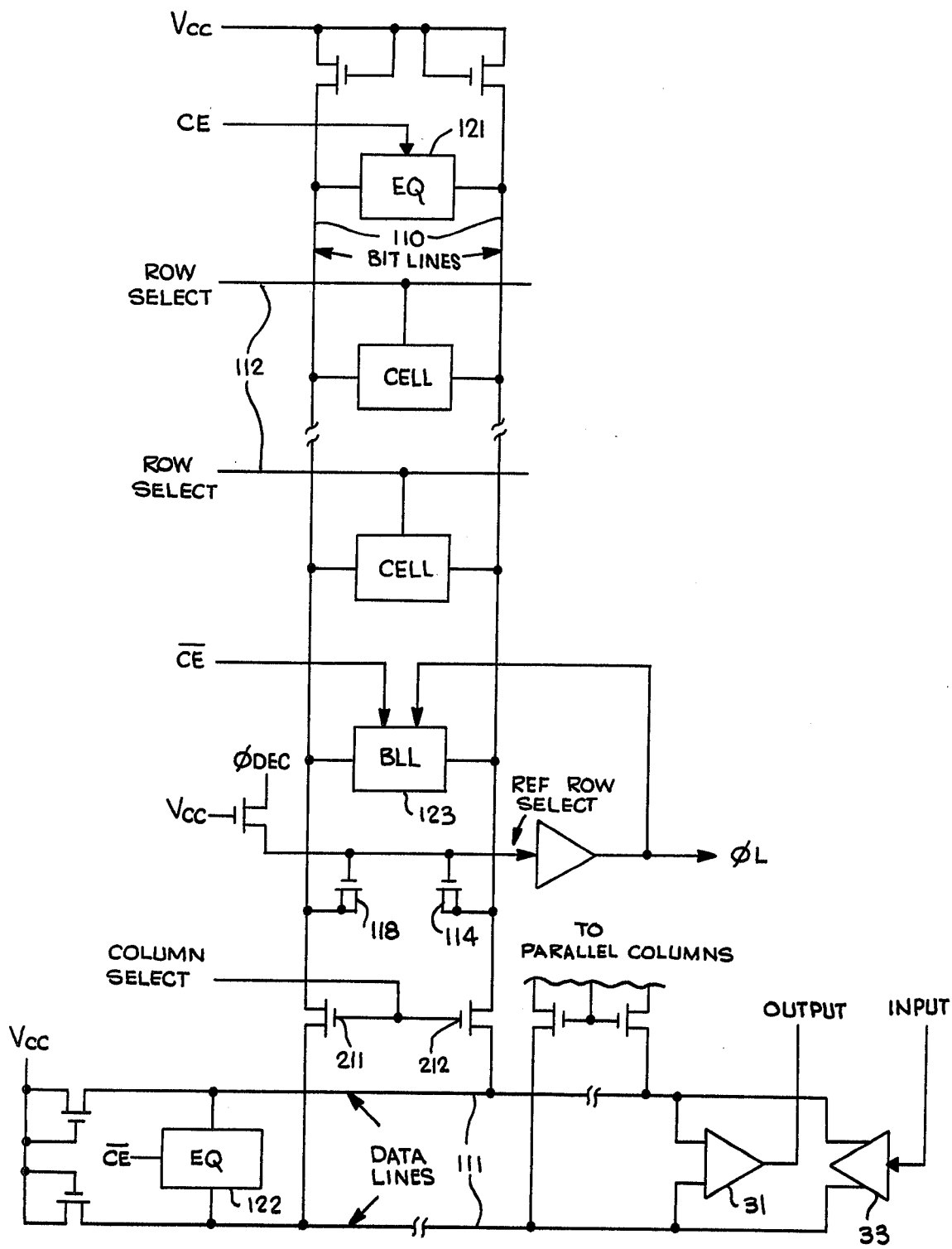
FIG. 7 is a block diagram showing the organization of bit lines and data lines in the storage cell matrix of FIG. 1.

FIG. 7 shows the bit line column and data line organization. A total of 64 cells, one from each row, are connected to one bit line pair to form a column of cells. Columns are connected in parallel through the column select transistors to form the data lines 111. The data lines 111 feed into a sense amplifier 31 or are fed from the write amplifier 33. There are four pairs of data lines with four sets of input/output circuits and 16 columns are connected to each pair of data lines.

Figure 13A:
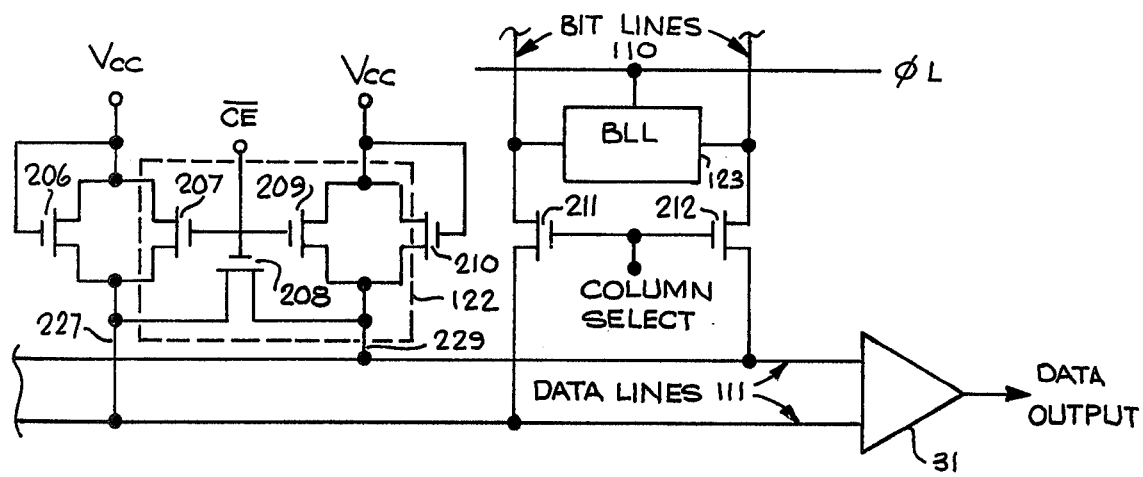
FIG. 13a and 13b are circuit diagrams showing memory status generation.

In addition to the storage cells, each column contains the reference row transistors 118, 119 and two other circuits labeled in FIG. 7 as EQ and BLL. The EQ circuit 121 is an equalizer circuit and active only during the preset time when CE is low. It is used to balance and equalize the bit lines 110 and bring them to a voltage level somewhat below $V_{cc}$. The same EQ circuit 122 is also used with the data lines 111. The Detailed construction of EQ circuit 122 is shown in FIG. 13a, discussed below.

Figure 10:
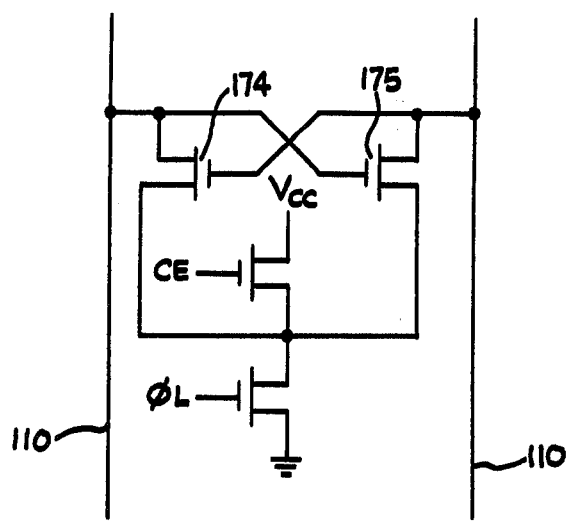
FIG. 10 is a schematic of a Bit Line Latch, indicated in FIG. 7 by the abbreviation BLL.

The BLL circuit 123 is a Bit Line Latch, shown in more detail in FIG. 10, that is inactive during preset and is used during the active portion of the cycle to help the selected cell discharge the capacitive load presented by the bit and data lines. It is controlled by $\phi L$, a timing signal derived from the reference row of transistors 118, 119. The cross coupled transistors 174, 175 assist cell discharge by overcoming capacitance upon receipt of a signal, $\phi_L$, described below.

Figure 6:
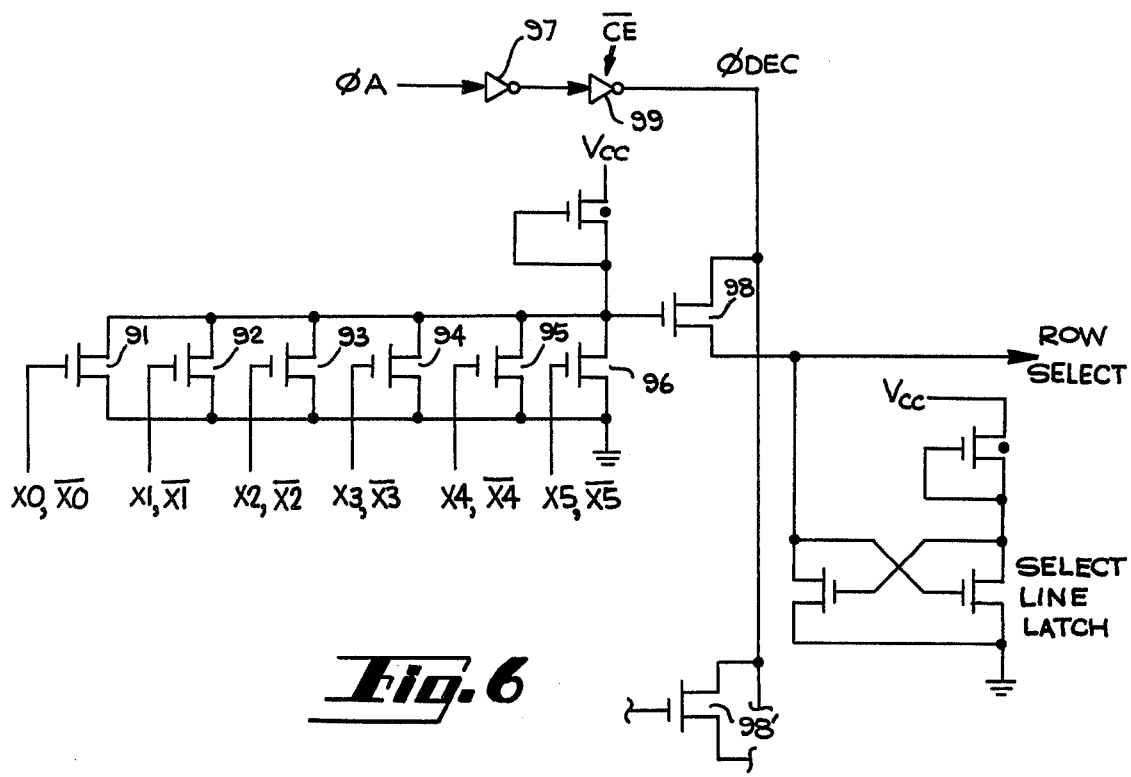
FIG. 6 is a schematic diagram of a row decoder circuit.

The row driver, 98 in FIG. 6 for the reference row is always enabled and the reference row is therefore selected by $\phi DEC$ on every cycle. The two reference transistors 118, 119 in each column are the same as the access devices in each cell that are driven by the other row select lines 112. When the reference row select signal has propagated all the way to the end of the row, it is buffered and used to generate $\phi L$. When $\phi L$ is true, the BLL is enabled and follows the state of the bit lines as set by the selected cell in that column.

The column decoders work much the same way as the row decoders, except that they are not turned on and off by a decode clock. During an active cycle, only one column is connected to one pair of data lines.

Figure 8:
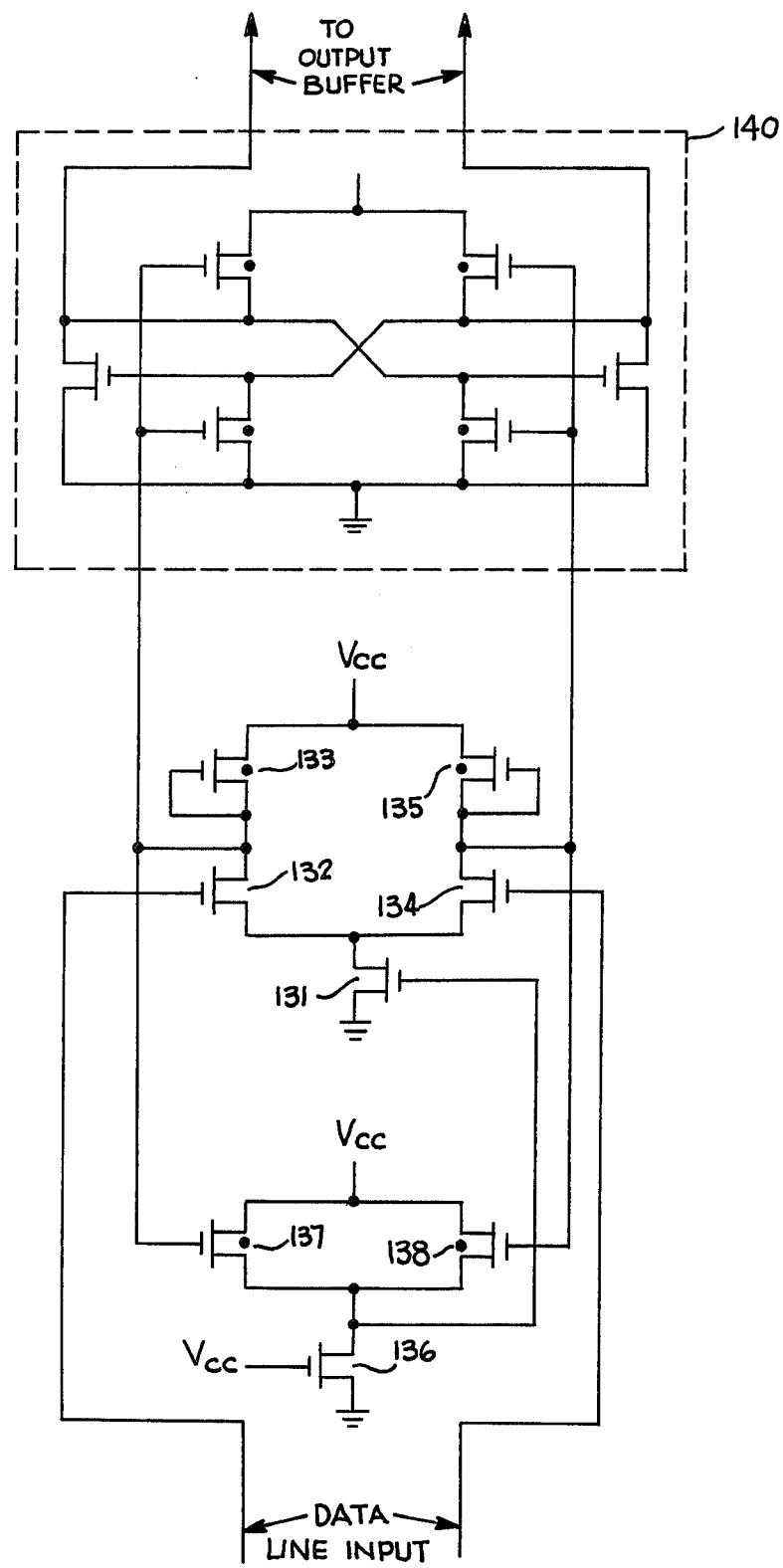
FIG. 8 is a schematic diagram of a sense amplifier shown in FIG. 1.

A unique feedback amplifier detects the state of the data lines 111 to provide read data for the output. The circuit in FIG. 8 shows a simple differential amplifier using transistors 132, 133, 134, 135 with a pedestal voltage established by transistors 136, 137 and 138. The output from the differential stage is fed back to influence the pedestal via transistors 136, 137 and 138. Notice that differential signals are balanced out and eliminated from the feedback loop. But supply voltage, temperature and process variations cause common mode shifts that are compensated for.

The output of the differential stage also goes to a latch circuit 140 that squares and buffers the amplified signal. The latch simply follows the data that flows into it and feeds information to the output data register.

Figure 9:
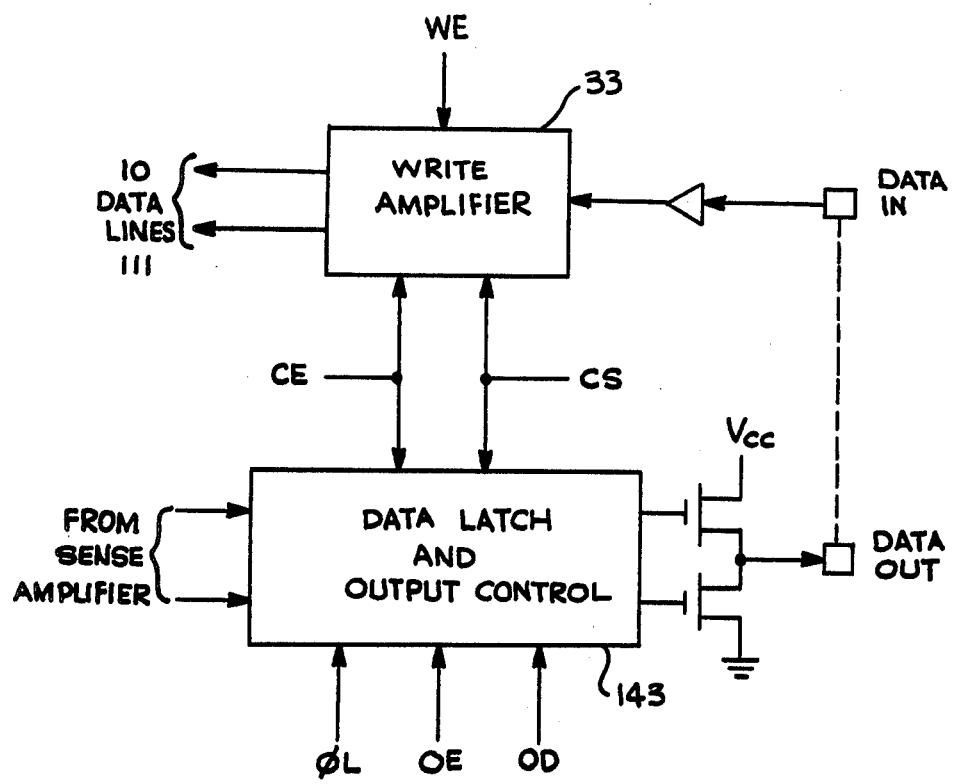
FIG. 9 is a block diagram of input/output control circuits.

The output stage shown in FIG. 9 includes the output data register plus the output control logic plus the output buffer. Information from the sense amplifier can flow into and through the register and on to the output pin at the access time. As long as the CE clock is high, the cell addressing will be valid and the sense amplifier and output can remain stable. When CE goes low, the register inputs are isolated from the sensed data and the output can stay valid until CE next goes high.

There are several signals that can turn off the output buffer. Only when they are all simultaneously in the necessary state will the output turn on. When CE goes high, the output will turn off until the access time arrives as indicated by $\phi L$. When $\overline{CS}$ is latched high, the output will be off. When OE is low the outputs will be off. When OD is high the outputs will be off.

The write amplifier control logic only allows a write to take place on a selected chip with the CE high and the Write Enable low. Note that the WE line does not affect the output buffer.

The Memory Status output is derived from the internal $\phi L$ timing signal that is in turn derived from the true performance of the reference row, transistors 118, 119 in FIG. 7. Reference transistors, 118, 119, are duplicated in each column of the memory array. These transistors are matched in performance to the transistors of each memory cell, thereby permitting the performance of the transistors in the reference row to track the performance of the transistors in the memory array. The $\phi_L$ signal is derived after propagation of $\phi_{DEC}$ through the reference row thereby indicating when the slowest bit in the memory row has been accessed. The signal derived from the reference row, $\phi_L$, may then be used to strobe various circuits which could utilize a timing control such as bit line latches, output controls and other circuits. MS uses the identical output buffer, control logic, register and sense amplifier circuitry as used in the data path. At the input to the MS sense circuit, a pseudo data line pair is created that is directly analogous to the array data lines, including the EQ and column select devices. Previously, with reference to FIG. 7, the role of EQ circuit 122 was described. With reference to FIG. 13a, the details of EQ circuit 122 may be seen within the dashed line. Transistors 207 and 209 charge the data lines 111 through lines 227, 229 respectively. To achieve equalization of the data lines 111 a $\overline{CE}$ signal is applied to the gate of transistor 208 causing conduction therethrough and equalization of the lines 227, 229, thereby equalizing the data lines 111. Transistors 207, 208 and 209 will all be on when $\overline{CE}$ is high.

Figure 13B:
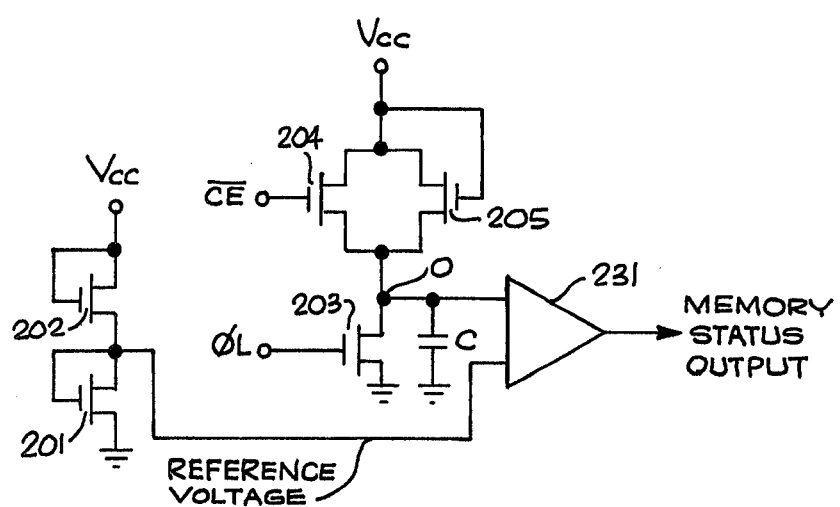

FIG. 13b is a schematic indicating how the memory status is formed. A pair of symmetrically balanced transistors 204, 205 are constructed in a circuit configuration analogous to the configuration of transistors 206 and 207 in FIG. 13a. When a $\overline{CE}$ signal causes equalization of data lines 111, as previously explained, the same signal will cause the voltage on node 0 to be pulled up toward $V_{cc}$. $\phi_L$, in addition to clocking the BLL circuit 123, as previously described, also turns on transistor 203, discharging capacitor C, thereby generating the rising MS edge through amplifier 231. By proper choice of transistor 203, capacitor C and the reference voltage for amplifier 231, MS will follow data out and the internal preset time quite closely.

When CE is low, $\overline{CE}$ goes high turning transistors 207, 208, 209 and 210 in FIG. 13a to preset the bit and data lines. Analogously, $\overline{CE}$ turns on transistor 204 bringing MS low at the end of the memory preset period.

Since the final output circuits are the same for both MS and Data, they respond identically to variations in loading. If the data output is heavily loaded, then similar equivalent loading should be used on the Memory Status output in order to maintain their responses relative to each other.

The MS output is always enabled and never enters a three-state off mode. Even on an unselected chip, the MS signal continues to reflect the status of the memory.

Figure 11A:
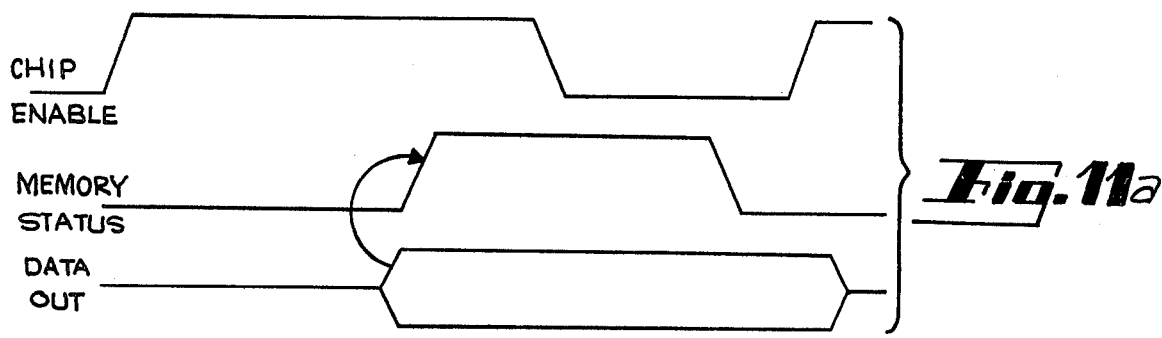
FIGS. 11a, 11b and 11c are timing diagrams showing the relation between the chip enable signal and the memory status signal.
Figure 11B:
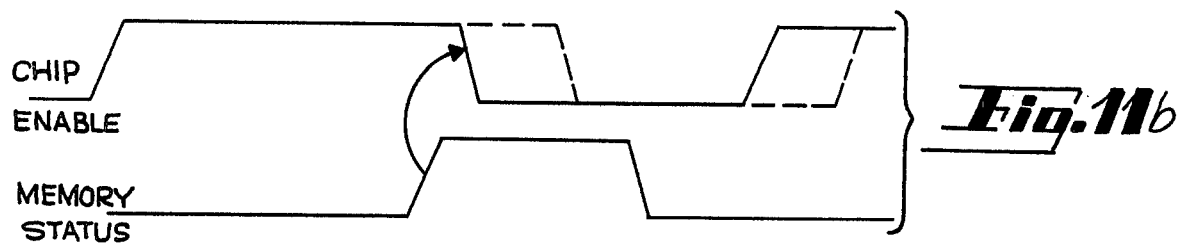

FIGS. 11(a), (b), (c) show the timing information conveyed by the MS output. In FIG. 9(a) the rising edge of MS indicates that output data is valid and makes a convenient strobe for output to the rest of the system. When several chips are being used in parallel, the Memory Status signal from the slowest chip should be the strobe in order to assure that all the data bits are available and valid. There is a brief nominal delay from the worst-case output data to the rising edge of MS. That time is always greater than zero under similar loading conditions for the two signals. The front edge of MS also specifies the end of the time that CE must be held high for that operation. See FIG. 11(b). Though CE may be high as long as desired, it may safely go low any time after MS goes high. MS will stay high until the internal preset operation is complete. Thus, it will not go low until some time after CE goes low and the total time that MS is high depends not only on the actual operating conditions of the memory, but also the delay from MS high to CE low.

Figure 11C:
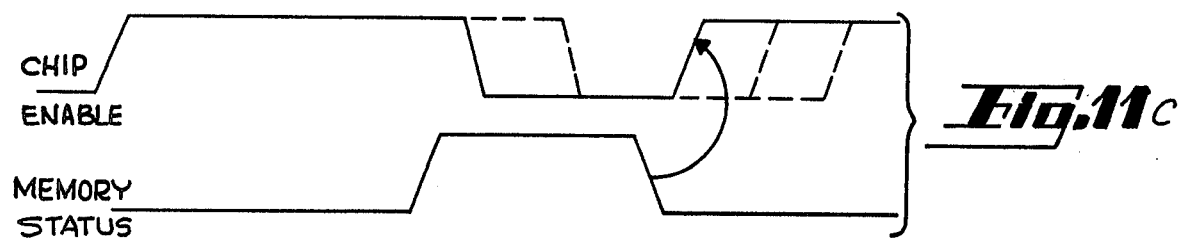

The falling edge of MS specifies that the memory is ready for a new operation to be initiated. See FIG. 11(c). When several chips are operated in parallel, the latest falling edge will indicate the earliest time that their CE should go high. The chip with the longest access time will also be the chip with the longest preset time.

Memory Status is derived from the selection of the row of reference cells in FIG. 1 and the reference row is always doing a read operation. Thus, the MS output will appear in every operating cycle, whether a read or a write is being performed. If the Write Enable, WE, line is low at the start of the cycle, and if the input data are present at the same time, MS may be considered a valid indication that the write is complete and CE may be switched low. However, if WE is not low or input data are not present until sometime later in the cycle, then the worst-case write timing requirements must be observed, independent of indications from the rising edge of MS. The falling edge of MS will be fully valid in any type of cycle.

Figure 12A:
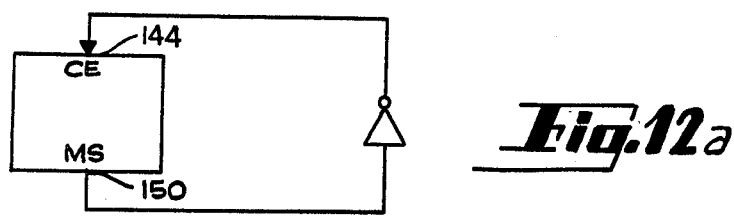
FIG. 12a is a block diagram for a self clocking memory.
Figure 12B:
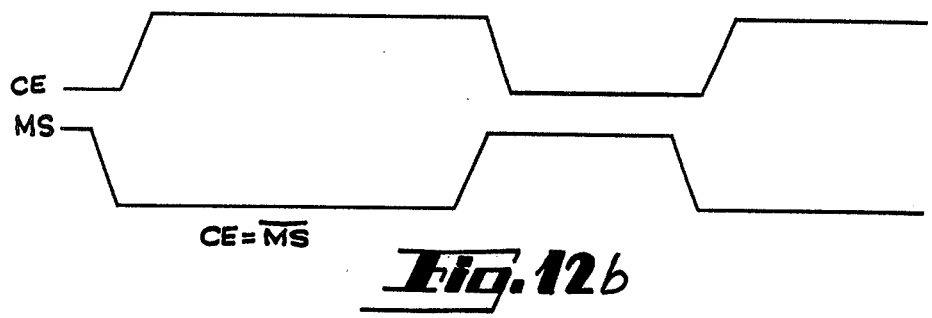

Since the requirements for the two transistions of the Chip Enable clock can be fully specified by the transitions of the Memory Status output, these memories can be effectively self-clocking. The MS output 150 may be inverted and then used as the CE input 144 as shown in FIGS. 12a and 12b. Not only will the memory run properly, but it will run at its best frequency for any given set of operating conditions and it will change that frequency as the conditions change. There are many potential capabilities implied by the Memory Status concept, including: adaptive self-timed memories, true asynchronous operations, elimination of support circuit skews, temperature compensation, new memory architectures, improved speedpower ratio, etc.

Figure 14:
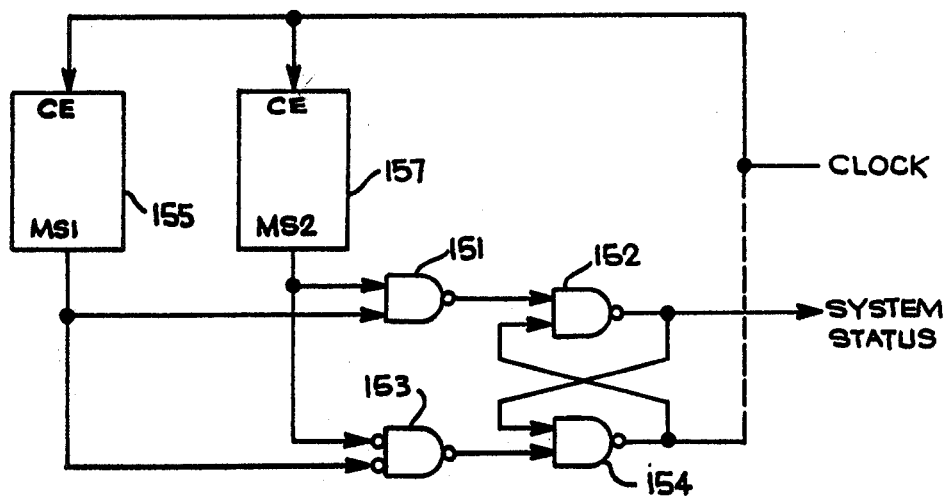
FIG. 14 is a schematic diagram showing use of a latch in combination with two memories having memory status signals.

FIG. 14 shows logic for combining multiple Memory Status signals. Gate 151 is used to detect when both MS outputs from RAMs 155, 157 are high indicating that output data is available. Similarly, gate 153 detects that both MS outputs are low, indicating that the preset period is complete for both chips. The inputs to the coordinating logic can of course be expanded to handle as many chips as desired.

To combine these two pieces of status information, a cross-coupled latch formed by gates 152, 154 can be added. Since there are times when neither condition is true, the latch serves to maintain the previous status indication until a new state is valid. The result is a System Status signal that specifies for the system the same information that each MS signal specifies for an individual chip.

Figure 15:
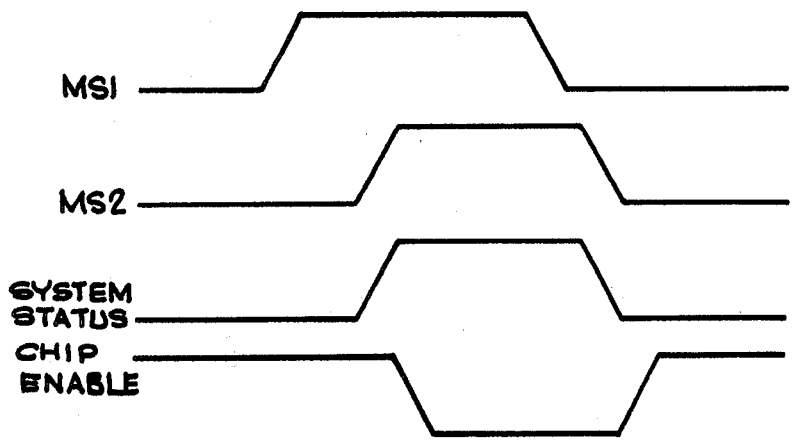
FIG. 15 is a timing diagram for the apparatus of FIG. 13.

The clock may be derived independently for synchronization with the using system. Alternatively, the System Status signal may be inverted and used for the CE clock as indicated by the dotted line. The timing for this arrangement is shown in FIG. 15. The memory will free-run at its best speed and the System Status will provide a synchronizing signal for use by the rest of the system.

Figure 16:
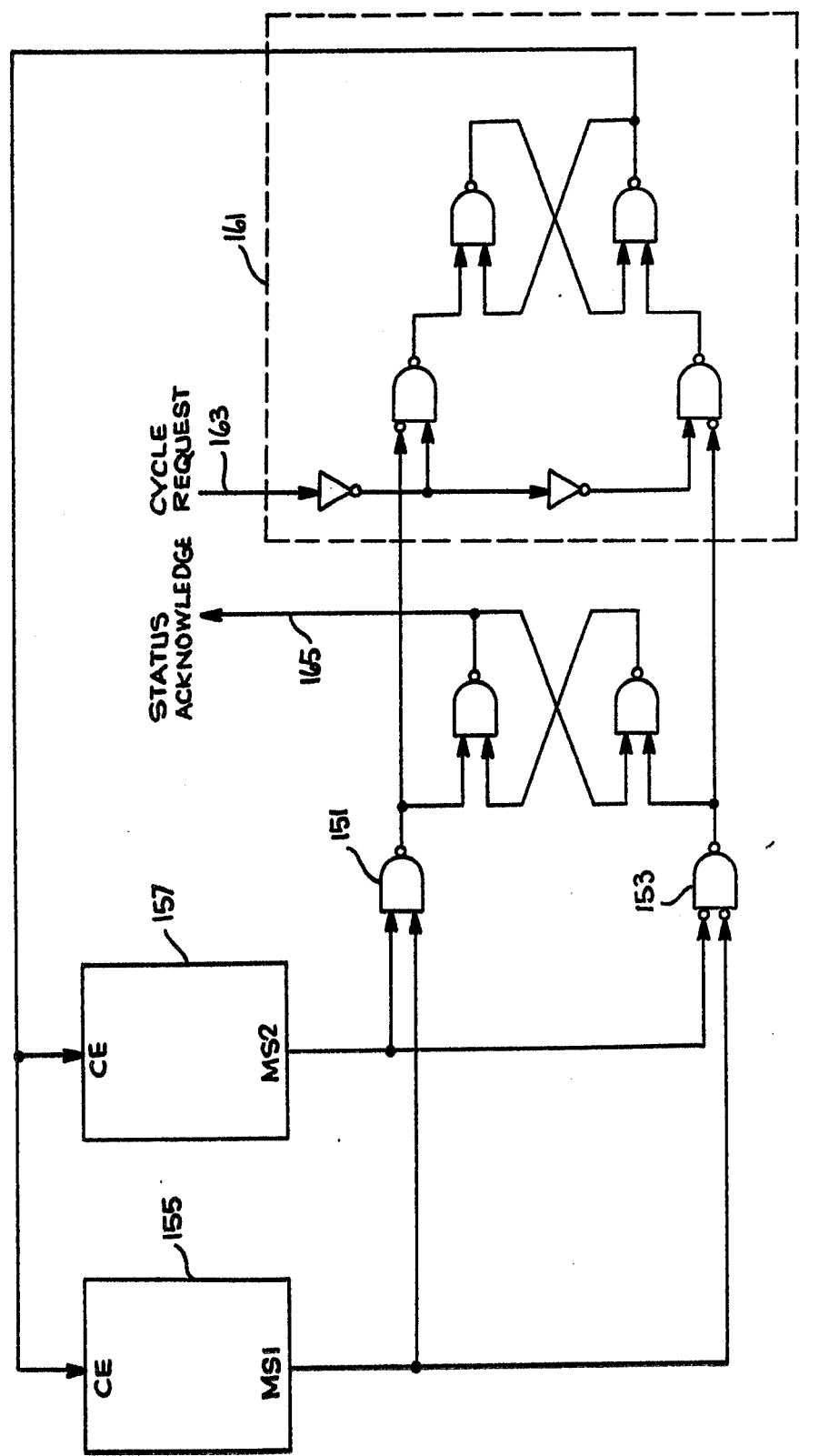
FIG. 16 is a schematic diagram showing a handshaking control circuit in combination with two memories having memory status signals.

For systems that cannot be memory-driven, for example the dual memory arrangement of FIG. 16, some means of controlling the clocking is needed. To permit the memory 155, 157 to single-step, an additional latch 161 is added to generate the clock so that the status information is derived independent of the clock control. When the Cycle Request, CR, input 103 is low, the memory will preset and prepare for an active cycle. When all is ready, Status Acknowledge 165, SA, will go low. When CR goes high, the memory will execute a cycle and will acknowledge conditions of access by bringing SA high. CR and SA then form a simple asynchronous handshaking pair for memory control. Notice that CR may go high at any time to start a cycle. If the chips are ready (SA low), the clock will proceed, but if preset is not complete (SA high) the memory will wait before initiating the requested cycle.

The timing for CR is quite simple. It should be held high until SA goes low. If SA is already low, a narrow CR pulse will suffice. Thus, a brief Cycle Request will cause the memory to execute one complete cycle and stop. If CR is held high, the memory will access (SA goes high) and then will leave the clock high until CR goes low. This allows Read/Modify/Write operations to be performed quite easily.

What is claimed is:

1. A method of timing random access semiconductor chip memories for indicating data availability and cycle completion, said memories of the type having data bit storage cells arranged in rows and columns with row and column address decoders connected to each respective row and column and at least one sense amplifier connected to data lines of said columns wherein the method comprises:

receiving a chip enable signal, CE, for initiating memory reading operation, in a static random access memory, delaying said chip enable signal, CE, by an amount of time to generate decoder signal $\phi_{DEC}$, directing said $\phi_{DEC}$ signal through rows of said random access memory, and generating an output latch signal, $\phi_L$, after said $\phi_{DEC}$ signal has propagated through one of said rows after each CE signal, said output latch signal enabling data in data bit storage cells to proceed outwardly to a sense amplifier latch, said output latch signal thereby indicating the memory status of data availability for reading.

2. The method of claim 1 further defined by reading data out of said sense amplifier when memory status indicates data availability.

3. The method of claim 1 further defined by generating said latch signal, $\phi_L$, after propagation of $\phi_{DEC}$ through a reference row of cells in said memory which is clocked with each $\phi_{DEC}$ signal.

4. The method of claim 1 further defined by directing said output latch signal, $\phi_L$, into bit line latches for assisting data bits stored in said data bit storage cells to proceed outwardly.

5. The method of providing a memory status signal in semiconductor random access chip memories of the type having rows and columns of data bit storage cells comprising,
providing a reference row of cells in a static random access memory in parallel with rows of data bit storage cells, said reference row of cells matched in performance to said other rows,
propagating a signal derived from a chip enable signal through said reference row,
receiving the propagated signal through said reference row and forming a memory status signal therefrom indicating data availability for reading.

6. A semiconductor memory comprising,
means for decoding row address bits,
means for decoding column address bits,
a static storage cell matrix having an array of data bit storage cells aligned in rows and columns and connected to said row and column latching and decoding means, each cell having a unique random access data address,
a reference row of cells in parallel with said rows of said storage cell matrix,
a first timing means connected to a first side of each row of cells for driving a selected row plus said reference row with a first timing signal, $\phi_{DEC}$,
means connected to a second side of said reference row of cells, opposite said first side, for generating an output latch signal, $\phi_L$, upon receipt of said first timing signal, $\phi_{DEC}$, after propagation through said reference row,
a bit line latch connected to each column adapted to receive said output latch signal, $\phi_L$, thereby enabling data in said data bit storage cells to proceed outwardly,
pairs of data lines connecting columns together and at least one sense amplifier connected to each pair of data lines adapted to receive data bits proceeding outwardly from said data bit storage cells and connected to deliver output data whereby said output latch signal, $\phi_L$, indicates the memory status of data availability in said sense amplifier.

7. The apparatus of claim 6 further defined by a sense amplifier means connected at a side of said reference row of cells opposite said first side for receiving said output latch, signal, $\phi_L$, and generating a memory status signal, MS, indicating data availability.

8. The apparatus of claim 6 wherein said first timing means is connected to said means for latching and decoding row and column address bits, said timing means receiving as an input a chip enable signal, CE, which is directed to said means for latching and decoding and upon propagation therethrough producing said first timing signal, $\phi_{DEC}$.

9. A handshaking control for a plurality of semiconductor random access memories comprising,
means for generating a memory status signal, MS, internally within each of a plurality of static random access memories, each memory indicating the availability of data for reading after propagation of another signal through each memory and forming the memory status signal therefrom, and
logic means connected to each memory status signal generating means for receiving the memory status signal, MS, from each memory and enabling all memories only after the last memory status signal has been received.

10. The apparatus of claim 9 wherein said logic means comprises a pair of series connected latches connected for receiving said memory status signal MS and generating a memory enabling signal, CE, connected to each memory.

11. An improved semiconductor chip memory operating at fastest memory capability comprising,
rows and columns of static random access data bit storage cells,
a reference row of cells matched in performance to said rows of data bit storage cells,
means connected to said rows and columns and said reference row for receiving a chip enable signal and propagating a chip enable derived signal through said reference row,
means connected to said reference row for receiving said chip enable derived signal after propagation therethrough and forming a memory status signal indicating data availability.

* * * * *